US010025193B2

(12) United States Patent
Cekli et al.

(10) Patent No.: US 10,025,193 B2
(45) Date of Patent: Jul. 17, 2018

(54) LITHOGRAPHIC APPARATUS, DEVICE MANUFACTURING METHOD AND ASSOCIATED DATA PROCESSING APPARATUS AND COMPUTER PROGRAM PRODUCT

(71) Applicant: ASML Netherlands B.V., Veldhoven (NL)

(72) Inventors: Hakki Ergün Cekli, Eindhoven (NL); Xing Lan Liu, Veldhoven (NL); Daan Maurits Slotboom, Wolphaartsdijk (NL); Wim Tjibbo Tel, Helmond (NL); Stefan Cornelis Theodorus Van Der Sanden, Nijmegen (NL); Richard Johannes Franciscus Van Haren, Waalre (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/109,784

(22) PCT Filed: Oct. 23, 2014

(86) PCT No.: PCT/EP2014/072717
§ 371 (c)(1),
(2) Date: Jul. 5, 2016

(87) PCT Pub. No.: WO2015/104074
PCT Pub. Date: Jul. 16, 2015

(65) Prior Publication Data
US 2016/0334712 A1 Nov. 17, 2016

(30) Foreign Application Priority Data
Jan. 10, 2014 (EP) .................................. 14150722

(51) Int. Cl.
*G03F 7/20* (2006.01)
*G03F 9/00* (2006.01)

(52) U.S. Cl.
CPC ........ *G03F 7/70141* (2013.01); *G03F 9/7003* (2013.01); *G03F 9/7092* (2013.01)

(58) Field of Classification Search
CPC ... G03F 9/7003; G03F 9/7092; G03F 7/70633
See application file for complete search history.

(56) References Cited

U.S. PATENT DOCUMENTS 6,654,096 B1 11/2003 Fujita et al.
7,012,672 B2 3/2006 Van Rhee et al.
(Continued)

FOREIGN PATENT DOCUMENTS

JP 2006-157014 6/2006
KR 10-2009-0085702 8/2009
(Continued)

OTHER PUBLICATIONS

International Search Report and Written Opinion dated Jan. 21, 2015 in corresponding International Patent Application No. PCT/EP2014/072717.
(Continued)

*Primary Examiner* — Steven H Whitesell Gordon
(74) *Attorney, Agent, or Firm* — Pillsbury Winthrop Shaw Pittman LLP

(57) ABSTRACT

A lithographic apparatus applies a pattern repeatedly to target portions across a substrate. Prior to applying the pattern an alignment sensor measures positions of marks in the plane of the substrate and a level sensor measures height deviations in a direction normal to the plane of the substrate. The apparatus applies the pattern to the substrate while positioning the applied pattern using the positions measured by the alignment sensor and using the height deviations
(Continued)

measured by the level sensor. The apparatus is further arranged to calculate and apply corrections in the positioning of the applied pattern, based on derivatives of the measured height deviations. The corrections may be calculated on an intrafield and/or interfield basis. The corrections may be based on changes between the observed height deviations and height deviations measured previously on the same substrate.

20 Claims, 5 Drawing Sheets

(56) References Cited

U.S. PATENT DOCUMENTS

| | | |
|---|---|---|
| 7,206,058 B2 | 4/2007 | Modderman et al. |
| 7,683,351 B2 | 3/2010 | Mos et al. |
| 7,791,727 B2 | 9/2010 | Den Boef et al. |
| 8,345,265 B2 | 1/2013 | Bijvoet |
| 8,687,167 B2 | 4/2014 | Padiy et al. |
| 8,976,355 B2 | 3/2015 | Van Der Sanden et al. |
| 9,177,219 B2 | 11/2015 | Tel et al. |
| 2004/0239905 A1 | 12/2004 | Van Rhee et al. |
| 2006/0033921 A1 | 2/2006 | Den Boef et al. |
| 2006/0114436 A1* | 6/2006 | Oesterholt ............ G03F 7/707 355/55 |
| 2006/0176459 A1 | 8/2006 | Modderman et al. |
| 2007/0212856 A1 | 9/2007 | Owen |
| 2010/0129741 A1 | 5/2010 | Bijvoet |
| 2012/0008127 A1 | 1/2012 | Tel et al. |
| 2012/0058434 A1* | 3/2012 | Khuat Duy ............ G02B 27/40 430/322 |
| 2013/0089935 A1 | 4/2013 | Vukkadala et al. |
| 2013/0090877 A1 | 4/2013 | Nagai |
| 2013/0230797 A1 | 9/2013 | Van Der Sanden et al. |
| 2014/0111779 A1 | 4/2014 | Chen et al. |

FOREIGN PATENT DOCUMENTS

| | | |
|---|---|---|
| KR | 10-2012-0026016 | 3/2012 |
| KR | 10-2012-0104636 | 9/2012 |

OTHER PUBLICATIONS

Korean Office Action dated Nov. 21, 2017 in corresponding Korean Patent Application No. 10-2016-7021798.
Taiwan Office Action dated Jan. 19, 2018 in corresponding Taiwan Patent Application No. 103138809.

* cited by examiner

LITHOGRAPHIC APPARATUS, DEVICE MANUFACTURING METHOD AND ASSOCIATED DATA PROCESSING APPARATUS AND COMPUTER PROGRAM PRODUCT

BACKGROUND

Field of the Invention

This application is the U.S. national phase entry of PCT patent application no, PCT/EP2014/072717, which was filed on Oct. 23, 2014, which claims the benefit of EP patent application no. 14150722.8, which was filed on Jan. 10, 2014, and which is incorporated herein in its entirety by reference.

The present invention relates to a method for determining overlay errors in a lithographic apparatus. The present invention further relates to methods of manufacturing devices using lithographic apparatus calibrated by such a method, and to data processing apparatuses and computer program products for implementing parts of such a method Background Art A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

A key performance parameter of the lithographic process is the overlay error. This error, often referred to simply as "overlay" is the error in placing a product features it the correct position relative to features formed in previous layers. As device structures become every smaller, overlay specifications become ever tighter.

Currently the overlay error is controlled and corrected by means of methods such as advanced process control (APC) described for example in US2012008127A1 and wafer alignment models described for example in US2013230797A1. The advanced process control techniques have been introduced in recent years and use measurements of metrology targets applied to substrates alongside the applied device pattern. These targets allow overlay to be measured using a high-throughput inspection apparatus such as a scatterometer, and the measurements can be used to generate corrections that are fed back into the lithographic apparatus when patterning subsequent substrates. The inspection apparatus may be separate from the lithographic apparatus. Within the lithographic apparatus wafer alignment models are conventionally applied based on measurement of alignment marks provided on the substrate, the measurements being as a preliminary step of every patterning operation. The alignment models nowadays include higher order models, to correct for non-linear distortions of the wafer. The alignment models may also be expanded to take into account other measurements and/or calculated effects such as thermal deformation during a patterning operation.

While alignment models and advanced process control have brought great reductions in overlay, not all errors are corrected. Some of these errors may be uncorrectable noise, for example, but others are correctable using available techniques in theory, but not economically correctable in practice. For example, one can envisage yet higher order correction but these in turn would require a higher spatial density of position measurements. The alignment markers/overlay targets occupy space on the substrate and are placed at specific locations, mainly in the scribe lanes between product areas. Deformations of the wafer grid in non-sampled areas (e.g. areas where ICs are printed) may be different than sampled areas. To increase the spatial density and/or measurement frequency of alignment marks and overlay targets would adversely affect both throughput of the lithographic process (wafers per hour) and the functional device area available on each substrate.

SUMMARY OF THE INVENTION

It is desirable to improve overlay performance without adding to the space occupied by alignment marks required on each substrate, and without adversely impacting throughput. It is further desirable that such improvement be obtained if possible using existing lithographic apparatus and associated hardware.

According to an aspect of the invention, there is provided a lithographic apparatus for applying a pattern onto a substrate, the apparatus including:

an alignment sensor for measuring positions of features on the substrate prior to applying said pattern said positions being measured in directions parallel to a plane of the substrate; and a controller arranged to control the lithographic apparatus to apply said pattern to the substrate while controlling the positioning of the applied pattern in said parallel directions using the positions measured by said alignment sensor, wherein said controller is further arranged to receive data representing local height deviations across the substrate prior to applying said pattern, and to calculate and apply corrections in the positioning of the applied pattern in at least one of said parallel directions, based on derivatives of the local height deviations.

In some embodiments, said controller is arranged to calculate said corrections based on changes in local slope values calculated from currently and previously measured height deviations across the substrate. Changes in height deviations between patterning one layer and patterning another layer can give rise to overlay.

In a particular embodiment, the apparatus further comprises a level sensor for measuring height deviations across the substrate after loading the substrate into the apparatus prior to applying said pattern, said controller is arranged to control positioning of the applied pattern in said normal direction using the height deviations measured by the level sensor, and said data representing local height deviations is used to calculate said corrections includes the height deviations measured by the level sensor prior to applying the pattern.

According to an aspect of the invention, there is provided a device manufacturing method comprising applying patterns in successive layers on a substrate, and processing the substrate to produce functional device features, wherein the step of applying a pattern in at least one of said layers comprises:

(a) measuring positions of features on the substrate in a lithographic apparatus, said positions being measured in directions parallel to a plane of the substrate; and (b) controlling the lithographic apparatus to apply said pattern to the substrate while controlling the positioning of the applied pattern in said parallel directions using the positions measured by said alignment sensor, (c) obtaining data representing local height deviations across the substrate prior to applying said pattern; and (d) calculating and applying corrections in the positioning of the applied pattern in at least one of said parallel directions, based on derivatives of the local height deviations.

The apparatus and method of the invention can be implemented in some embodiments by modifying control software of existing apparatuses.

The invention further provides a computer program product comprising machine-readable instructions for causing one or more processors to implement the controller of a lithographic apparatus according to the invention as set forth above.

The invention further provides a data processing system comprising one or more processors programmed to implement the controller of a lithographic apparatus according to the invention as set forth above.

The invention further provides a computer program product comprising machine-readable instructions for causing one or more processors to perform the steps (a) to (d) of a method according to the invention as set forth above.

The invention further provides a data processing system comprising one or more processors programmed to perform the steps (a) to (d) of a method according to the invention as set forth above.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figures 1, 2:
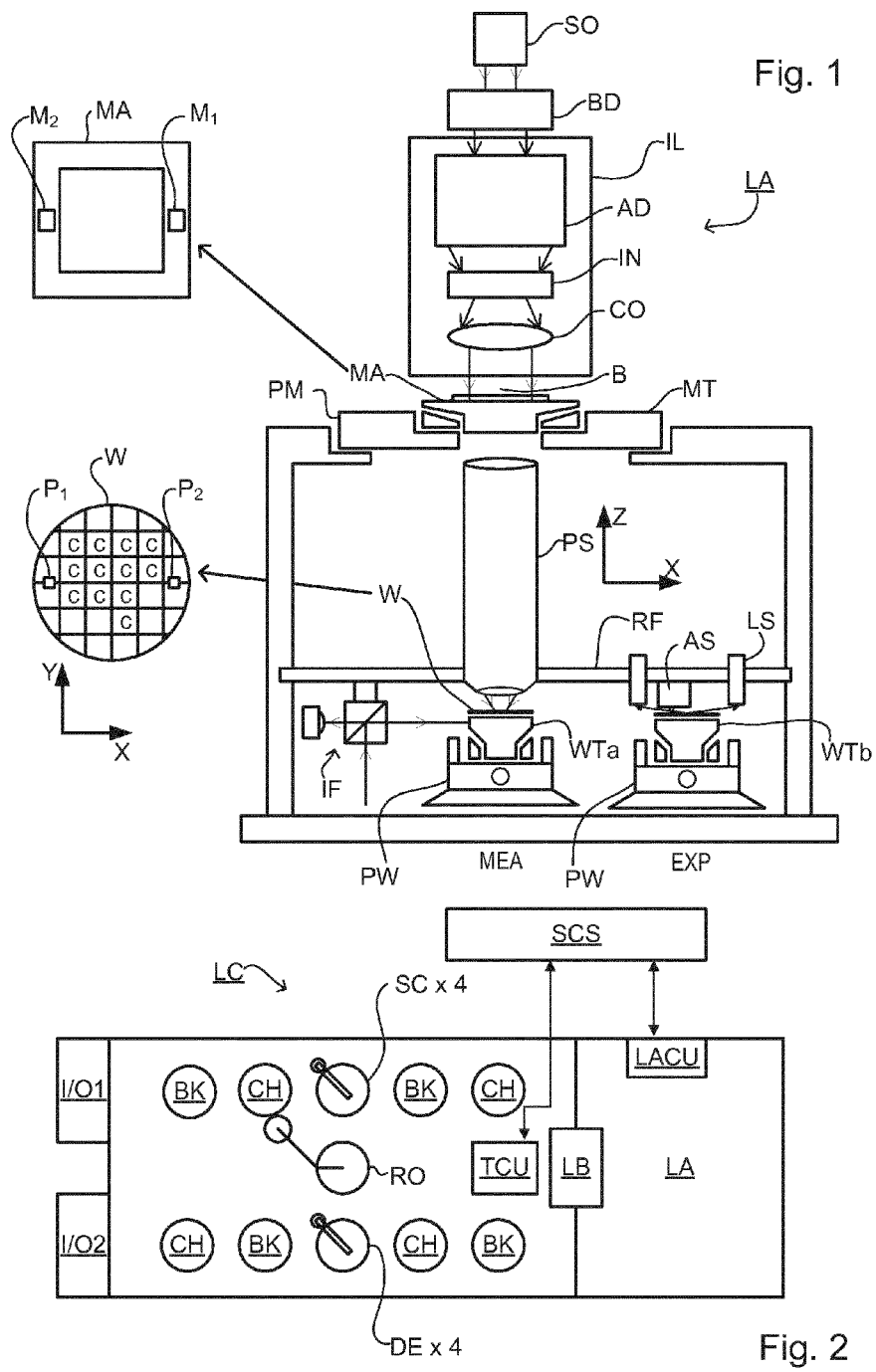
FIG. 1 depicts a lithographic apparatus according to an embodiment of the invention.
FIG. 2 depicts a lithographic cell or cluster incorporating the apparatus of FIG. 1.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography An example of a programmable mirror array employs a matrix arrangement of small mirrors, each of which can be individually tilted so as to reflect an incoming radiation beam in different directions The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the length (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned. Each target portion is commonly referred to as a "field", and contains one or more product dies in the finished product.

Combinations and/or variations on the above described modes of use or entirely different modes of use may also be employed.

Lithographic apparatus LA in this example is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency. The substrates processed by the track are then transferred to other processing tools for etching and other chemical or physical treatments within the device manufacturing process.

The lithographic apparatus control unit LACU controls all the movements and measurements of the various actuators and sensors described. LACU also includes signal processing and data processing capacity to implement desired calculations relevant to the operation of the apparatus. In the terminology of the introduction and claims, the combination of these processing and control functions referred to simply as the "controller". In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

The following sections describe both the conventional the novel alignment methods, implemented in the lithographic apparatus of FIG. 1.

Alignment Process Background

Figure 3:
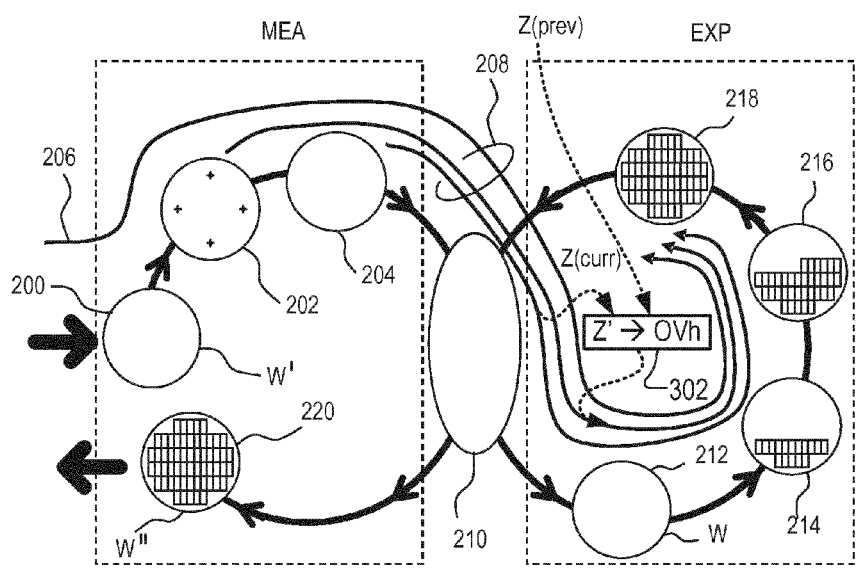
FIG. 3 illustrates schematically measurement and exposure processes in the apparatus of FIG. 1, according to known practice and modified in accordance with an embodiment of the present invention.

FIG. 3 illustrates the steps to expose target portions (e.g. dies) on a substrate W in the dual stage apparatus of FIG. 1. The process according to conventional practice will be described first.

On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. As will be explained further below, the present apparatus uses height map data also to supplement the alignment measurements.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further in US 2013230797A1, advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Even when advanced alignment models are used, errors inevitably remain in the overlay performance of the lithographic apparatus. An individual lithographic apparatus may also perform differently than other ones processing the same substrate. In order that the substrates that are exposed by the lithographic apparatus are exposed correctly and consistently, it is desirable to inspect exposed substrates to measure performance parameters such as overlay errors between subsequent layers, line thicknesses, critical dimensions (CD), etc.

An inspection apparatus is therefore used to determine the properties of the substrates independently of the alignment sensors AS, and in particular, how the properties of different substrates or different layers of the same substrate vary from layer to layer. The inspection apparatus (not shown in FIG. 2) may be integrated into the lithographic apparatus LA or the lithocell LC or may be a stand-alone device. It may be a scatterometer, for example an angle-resolved scatterometer of the time described in published US patent application US2006033921A1.

The inspection apparatus can also be used in an advanced process control (APC) system to calibrate individual lithographic apparatus and to allow different tools to be used more interchangeably. Improvements to the apparatus's focus and overlay (layer-to-layer alignment) uniformity have recently been achieved by the implementation of a stability module, leading to an optimized process window for a given feature size and chip application, enabling the continuation the creation of smaller, more advanced chips. The stability module in one embodiment automatically resets the system to a pre-defined baseline at regular intervals, for example each day. More detail of lithography and metrology methods incorporating the stability module can be found in US2012008127A1. The known example implements three main process control loops. The first loop provides the local control of the lithography apparatus using the stability module and monitor wafers. The second (APC) loop is for local scanner control on-product (determining focus, dose, and overlay on product wafers).

The third control loop is to allow metrology integration into the second (APC) loop (e.g., for double patterning). All of these loops use measurements made by the inspection apparatus, in addition to the measurements made in the during the actual patterning operations of FIG. 3.

Alignment Corrections Based on Height Map Data

While the above apparatuses and procedures have provided great improvements in overlay performance in particular, modern devices require even smaller features and ever improving overlay performance as a result. Some residual contributors to overlay are not corrected by the known control loops, for example because they have spatial frequency components outside the ranges corrected by the known techniques described above. While it may be simple in principle to measure and eliminate these residual components, for example by increasing the spatial density of metrology targets and measurements made across a substrate, such improvements would bring a large overhead in terms of (i) substrate area devoted to metrology instead of functional product features and (ii) measurement and processing time. The throughput of substrates (wafers per hour) and the functional device area per substrate would be adversely affected, which negates the benefit of reducing feature sizes in the first place.

The inventors have recognized that height map data that is already acquired as a precursor to the patterning step can be used to obtain additional corrections of alignment, to improve overlay. Moreover, the height map data is typically acquired with a much greater spatial density than is available with dedicated alignment marks and overlay targets. The novel apparatus uses derivatives of this height map data to calculate additional corrections of position in the X-Y plane. Therefore, no additional measurement processes or equipment is required to implement the novel method.

Referring again to FIG. 3, a height-based overlay correction module 302 is shown schematically within the exposure station. This module can be implements by suitable software running on any processor of the lithographic apparatus control unit LACU (FIG. 1). Module 302 receives the height map data Z(curr) that was measured in step 204 for the current substrate W. In the present embodiment, module 302 also receives height map data Z(prev) that was for the same substrate in a previous patterning step. Module 302 may actively retrieve this previous data from a database, or it may be supplied as part of the recipe data 206. From this data, which is typically sampled with a high density across all parts of the substrate, an additional overlay correction OVh is calculated.

The correction OVh may have components in the X and/or Y direction, and is used in addition to the alignment model using the alignment data from step 202, to apply fine corrections in the positioning of the pattern applied to substrate W in steps 214-218. The correction OVh may be provided in the form of separate interfield and intrafield components, as explained further below.

Figure 4:
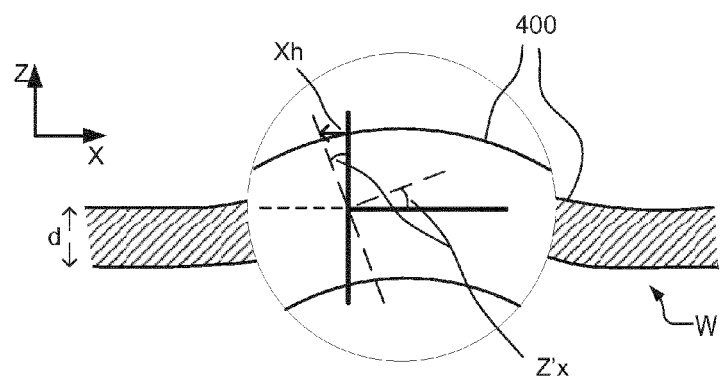
FIG. 4 illustrates schematically the derivation of a positional correction from height deviations measured on a substrate in the processes of FIG. 3.

FIG. 4 illustrates the principles of deriving a correction OVh from height data Z. Substrate W has an upper surface 400 on which a pattern is to be applied to form a new layer of product features. The height map data shows that the surface 400 deviates locally in the Z direction from a nominal plane. These deviations include deviations existing in the raw substrate. More significantly, they include deviations introduced by the various chemical and physical processing steps that are used to form device features in successive layers on the substrate. The cross-section shown in FIG. 4 is taken in the X-Z plane of the three-dimensional (X, Y, Z) Cartesian coordinate system. Similar height deviations and slopes may be measured in the Y-Z plane. Note that this height map data is collected by the lithographic apparatus while the substrate is clamped to the substrate table (WTa or WTb). Topography may be different when the substrate is free of any force. Nevertheless, it is within the scope of the invention to use derivation of wafer topography data from scanner or any off-line tool may be used in this invention.

Based on each height value Z and its neighbors, a derivative Z' is derived, representing in a simple example the local slope of the surface 400 at each point across the substrate. Using simple geometry and assuming that slopes are small so that a "small angle approximation" is valid, the following equations can be written:

$$Z'x = \frac{\partial z}{\partial x} \quad (1)$$

$$Xh = Z'x \times \frac{d}{2} \quad (2)$$

In these equations, Z' is the local slope in the X direction, and d is the wafer thickness. Xh represents a displacement in the X direction that is attributable (by the simple geometry illustrated in FIG. 4) to the height deviations. Similar equations may be written and applied to infer a displacement Yh with respect to the Y direction. These displacements Xh, Yh will result in features being formed on the surface 400 at a position other than the one intended. If the height map, including slopes and curvatures such as that illustrated in FIG. 4, is the same for each layer, then the displacements Xh and Yh would not change and there would be no consequent contribution to overlay.

In a real process, however, significant height deviations can be introduced between layers, so that Xh and Yh do indeed change from layer to layer. A first cause will be effects of processing that has occurred subsequent to patterning for the first layer. Another cause might be differences in the individual lithographic apparatus, substrate support etc., where different tools or even different substrate tables within the same tool are used to form the different layers. The resulting difference in the displacements Xh and Yh between two layers on the substrate will introduce overlay error when a pattern is applied to form the second layer, unless it is corrected. Using the current layer and previous layer height map data Z(prev) and Z(curr), overlay corrections OVh can be derived by calculating the difference between displacements Xh and Yh obtained for the current layer with those obtained for the previous layer. Note that for practical purposes it is irrelevant whether difference is calculated separately in X and Y, or in a combined vector form. The difference may be calculated in some other direction than X or Y, for example a radial direction from the center of the substrate. Examples below use a radial component of overlay when calculating interfield correction, for example, and use X and/or Y components when calculating intrafield corrections. The difference may be calculated between height maps Z before the derivatives Z' are calculated, or the difference can be calculated after displacements Xh and Yh have been calculated for each layer. In all cases the result is equivalent and the invention is not limited to any particular sequence of calculation. Also, the height map data may be used in the form of a grid of height samples, or the height deviations may be fitted to some model if preferred.

Figure 5:
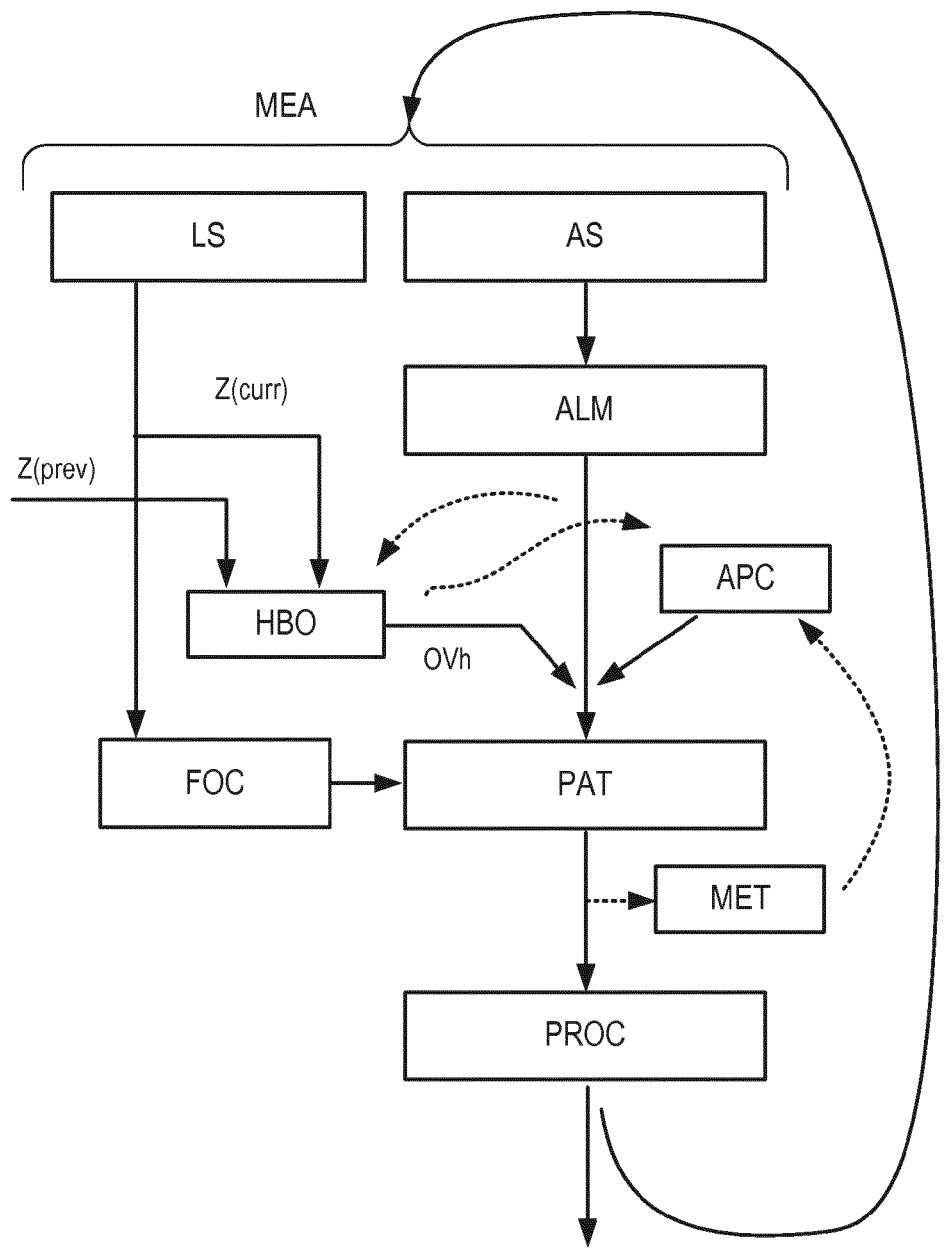
FIG. 5 is a flowchart of a process implementing one embodiment of the present invention.

FIG. 5 is a simple flowchart summarizing the novel method as described above in one exemplary embodiment. Substrates are measured using alignment sensor AS and level sensor LS. An alignment model ALM based on the alignment is used to control the positioning of an applied pattern in the patterning step PAT performed at exposure station EXP. The height map data from the level sensor is used in a focus control model FOC to control focus in the patterning step. After the pattern is applied to each target portion in patterning step PAT, the substrate is processed to create device features in accordance with the pattern. The substrate returns for further patterning until all product layers are complete.

Additionally to those conventional steps, current and previous height map data are supplied also to the height-based overlay correction module HBO (module 302 in FIG. 3). Additional corrections OVh in X and/or Y direction are supplied by the module 302 and used to refine the positioning. Yet further corrections may be supplied by the advanced process control module APC. The modules ALM, APC and HBO can be combined into single module.

Height-based overlay corrections OVh can be provided in intrafield and/or interfield forms. Intrafield corrections will be applied repeatedly at each target portion. Interfield corrections will be applied depending on the position of a current target portion on the substrate. These components can be used to correct height-based overlay arising from different processing effects.

As illustrated by dotted data paths, the APC module uses metrology data from an inspection apparatus MET to update control of the process. Where the module HBO reveals overlay errors can modeled and corrected in the process control loops, this may be done by pass-in-information between the modules as shown. Similarly, where height-based displacements are likely to be corrected in the alignment module, this information can be used to modify the corrections OVh to avoid double-correction. In practice, however, it is found that the height-based corrections OVh are quite complementary to those other correction models. This is primarily because (i) overlay error that can be corrected by the existing models is so corrected and does not appear in the height map data and (ii) the height map data by its nature reveals spatial frequency components of overlay that are not revealed by the other sensors, and are therefore not corrected by the existing models. This will be seen in the experimental examples that follow.

Experimental Basis

Figure 6:
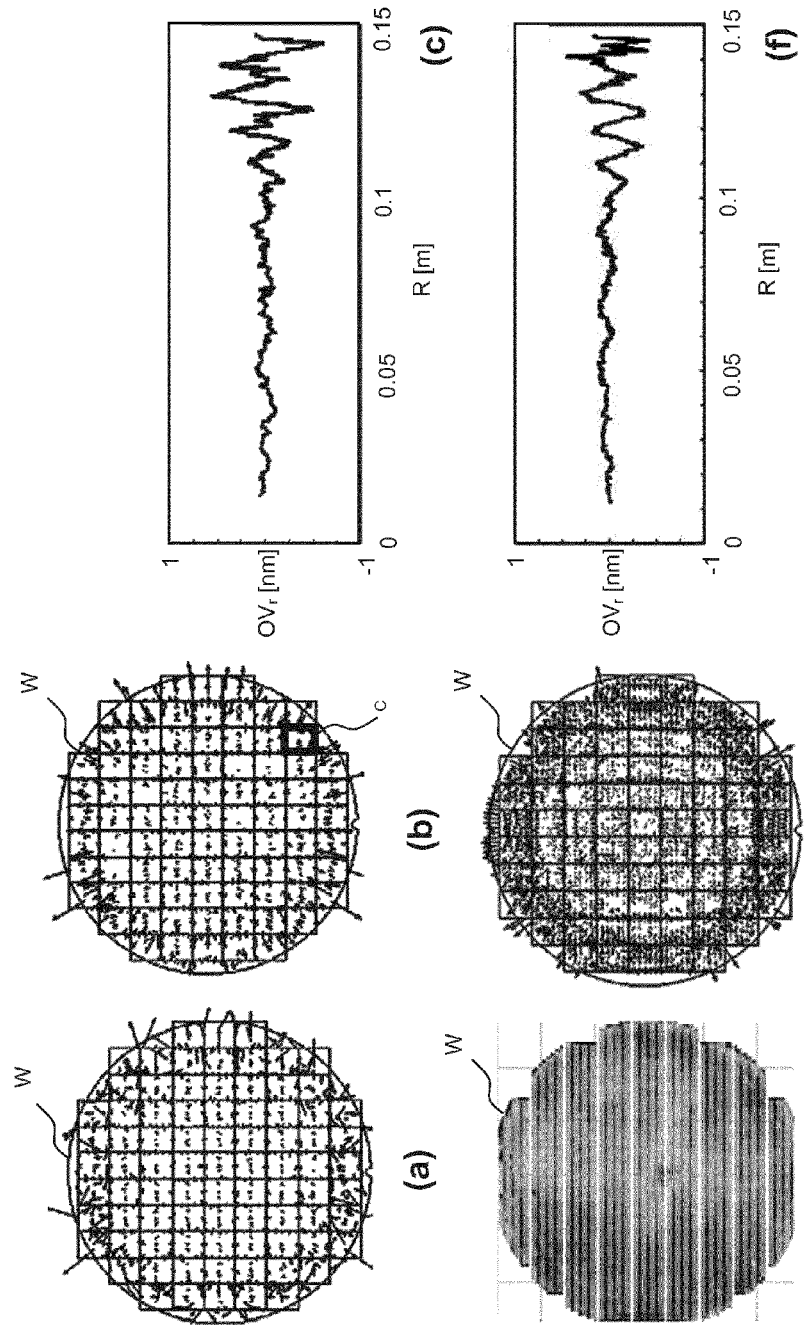
FIG. 6 compares (a), (b), (c) densely measured overlay map and (d), (e), (f) positional deviations inferred from height map data.
Figure 7:
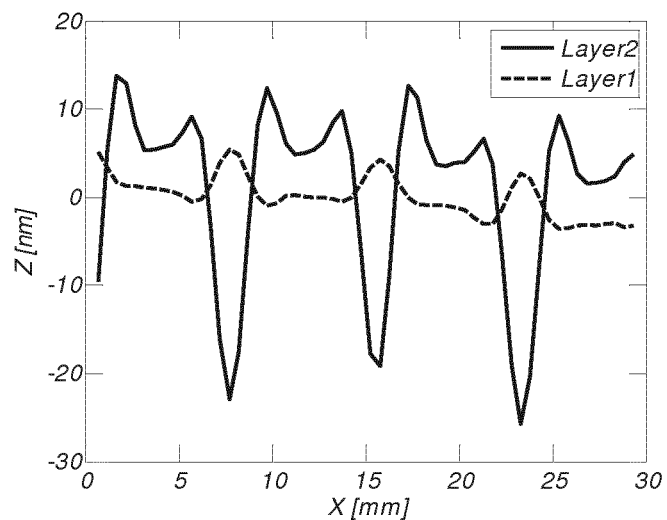
FIG. 7 presents an example plot of local wafer height deviations observed for two layers on a substrate.
Figure 8:
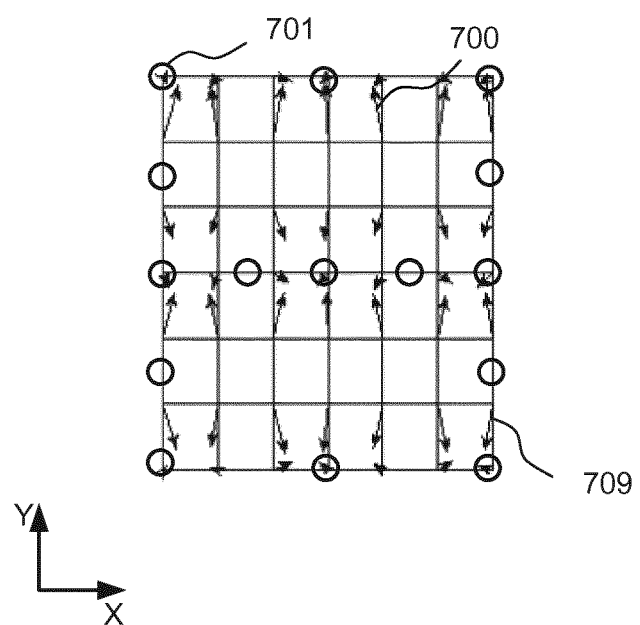
FIG. 8 compares locations of overlay targets and intrafield overlay errors inferred from the averages wafer height map data.

FIGS. 6-8 present experimental data verifying the potential of height-based overlay correction disclosed herein.

FIG. 6 presents overlay measurement differences between two subsequent layers obtained from a real substrate that has been provided with particularly dense distribution of overlay metrology targets. In the figure, (a) shows in the form of vectors an overlay map, (b) shows a radial component of the overlay map and (c) shows in graph form the radial dependence of overlay, revealed by this data. As can be seen in FIGS. 6(b) and (c), the radial component of overlay ($OV_r$) fluctuates little around the center of the wafer (for R→0, where R the radial position from the center to the outer edge at R=15 cm). However, oscillations (at period of the order of 1 cm) appear at a wafer radius greater than 100 mm.

FIG. 6(d) shows the wafer height map difference measured by level sensor LS for the same wafer (i.e. difference between height maps of two layers). At (e) we present a map of a radial component overlay OVh that is inferred from the height map delta of FIG. 6 (d) using Equations (1) and (2) above. Note that this graph includes only interfield effects, as the mean OVh map of all the fields (target portions C) has been calculated and subtracted at each field position. FIG. 6(f) presents the radial dependence of OVh across the radial component map of FIG. 6(e) in the form of a graph. By comparing FIGS. 6(c) and (f), similar oscillations (with similar periods) are observed at the wafer edges for both methods. This confirms that height-based overlay corrections can be effective to eliminate components of overlay that are not corrected by other means.

Another example application of the novel method is shown in FIGS. 7 and 8. FIG. 7 presents an example plot of the wafer height Z against X position for two layers on the same substrate. The pattern of height deviations has a strong repetitive component because distortion is caused to a large degree by the multiple layers of processing in the product areas. The topography change by processing may transfer a different signature when the wafer clamped on the wafer table. The field width is about 15 mm Height variations can be tens of nanometers across a product, while forthcoming "3-D" products can experience height deviations of hundreds of nanometers, and even 1 μm or more. FIG. 8 shows a height-based overlay profile 700 averaged over all the fields on a substrate. That is to say, the arrows represent overlay values OVh inferred from a wafer height map. Circles 701 represent the locations of overlay metrology targets in each field. Notice that the spatial density of height samples (square grid) is much greater than the density of overlay metrology targets. Moreover, while overlay is small in areas where the overlay targets 701 are placed (scribe lane areas), the height-based calculation reveals strong, high-spatial frequency variations in overlay in areas where integrated circuits product features reside. This difference may generate a mismatch between target-measured overlay and real-device during manufacturing. The profile of FIG. 8 shows a dependence of the overlay profile mainly in the Y direction. This dependency may be corrected relatively easily in the scanning operation in the lithographic apparatus LA.

In a real application, intrafield corrections such as are illustrated in FIG. 8 can be combined with interfield corrections of the type shown in FIG. 6. The height map data and corrections can be measured and calculated for every substrate, or they may be calculated once and applied to several substrates, where similar effects are expected. Interfield variations for a process may be calculated once using test wafers and applied to product substrates, while intrafield variations are measured and calculated and corrected on the product wafers (and vice versa). Previous wafer height map data Z(prev) can come from the previous measurement of the same wafer, or it may be inferred from an average or sample.

CONCLUSIONS

In conclusion, the novel method, for monitoring and/or correcting overlay between layers, requires as input parameter available, stored height map data. The novel method converts height maps into overlay corrections using simple equations. This novel method may be implemented in parallel with current methods. Furthermore, the novel method requires no change in the hardware of a lithography system and uses as input data, data that have already been measured and stored during the lithographic manufacturing process.

Using the level sensor data to calculate overlay corrections has advantages in that (i) that data is typically captured with high density and available within the lithographic apparatus already and (ii) the data is captured after the substrate has been loaded into the apparatus and has been clamped to the substrate table exactly as it will be clamped during the exposure or other patterning step. However, it is also possible to use height map data from other sources, that may be available. For example, wafer topography data can come from an external metrology tool. Any information related to wafer topography (height deviations) may be used, whether it is a measured height map or measured indirectly, for example being height data inferred from processing history and the like. As in the example of level sensor data above, the height data from other sources may include samples at positions not covered by alignment marks and/or by overlay targets. The height measurements may optimally be taken with a higher spatial density than alignment marks, and/or than overlay targets.

In an embodiment, there is provided a lithographic apparatus for applying a pattern onto a substrate, the apparatus including: an alignment sensor for measuring positions of features on the substrate prior to applying the pattern the positions being measured in directions parallel to a plane of the substrate; and a controller arranged to control the lithographic apparatus to apply the pattern to the substrate while controlling the positioning of the applied pattern in the parallel directions using the positions measured by the alignment sensor, wherein the controller is further arranged to receive data representing local height deviations across the substrate prior to applying the pattern, and to calculate and apply corrections in the positioning of the applied pattern in at least one of the parallel directions, based on derivatives of the local height deviations.

In an embodiment, the controller is arranged to calculate the corrections based on local slope values calculated from the height deviations across the substrate. In an embodiment, the controller is arranged to receive from a database previous measurements of height deviations made prior to applying a pattern previously on the same substrate or a similar substrate, and to calculate the corrections based on a change between currently and previously measured height deviations. In an embodiment, the controller is arranged to calculate the corrections based on changes in local slope values calculated from currently and previously measured height deviations across the substrate. In an embodiment, the apparatus further comprises a level sensor for measuring height deviations across the substrate after loading the substrate into the apparatus prior to applying the pattern, the controller is arranged to control positioning of the applied pattern in the normal direction using the height deviations measured by the level sensor, and wherein the data representing local height deviations is used to calculate the corrections includes the height deviations measured by the level sensor prior to applying the pattern. In an embodiment, the corrections are calculated with regard to other corrections being made by the controller, so to avoid correcting positioning errors that would be corrected by another mechanism. In an embodiment, the apparatus is arranged to apply the pattern repeatedly to successive target portions over the substrate, and the corrections include interfield corrections that are calculated and applied for a target portion in accordance with its position on the substrate. In an embodiment, the interfield corrections for each target portion include corrections calculated by reference to a radial position of the target portion on the substrate. In an embodiment, the corrections further include intrafield corrections that are calculated and applied to every target portion independently of the position of the target portion across the substrate. In an embodiment, the apparatus is arranged to apply the pattern repeatedly to successive target portions over the substrate, and the corrections include intrafield corrections that are calculated and applied to every target portion independently of the position of the target portion across the substrate. In an embodiment, the intrafield corrections are calculated based on height deviations that are observed within each target portion when averaged across many target portions. In an embodiment, the corrections are calculated with regard to other corrections being made by the controller, so as to avoid overcorrecting positioning errors that would be corrected by another mechanism.

In an embodiment, there is provided a device manufacturing method comprising applying patterns in successive layers on a substrate, and processing the substrate to produce functional device features, wherein the step of applying a pattern in at least one of the layers comprises: (a) measuring positions of features on the substrate in a lithographic apparatus, the positions being measured in directions parallel to a plane of the substrate; and (b) controlling the lithographic apparatus to apply the pattern to the substrate while controlling the positioning of the applied pattern in the parallel directions using the positions measured by the alignment sensor, (c) obtaining data representing local height deviations across the substrate prior to applying the pattern; and (d) calculating and applying corrections in the positioning of the applied pattern in at least one of the parallel directions, based on derivatives of the local height deviations.

In an embodiment, the corrections are calculated based on local slope values calculated from the height deviations across the substrate. In an embodiment, step (c) further includes receiving from a database previous measurements of height deviations made prior to applying a pattern previously on the same substrate or a similar substrate, and in step (d) corrections are calculated based on a change between currently and previously measured height deviations. In an embodiment, the controller is arranged to calculate the corrections based on changes in local slope values calculated from currently and previously measured height deviations across the substrate. In an embodiment, the method further comprises (a1) measuring height deviations across the substrate using a level sensor in the lithographic apparatus after loading the substrate into the apparatus prior to applying the pattern, wherein step (b) controlling positioning of the applied pattern in the normal direction using the height deviations measured by the level sensor, and wherein in step (c) the data representing local height deviations used to calculate the corrections includes the height deviations measured by the level sensor in step (a1). In an embodiment, the corrections are calculated with regard to other corrections being made, so as to avoid correcting positioning errors that would be corrected by another mechanism. In an embodiment, the lithographic apparatus is controlled to apply the pattern repeatedly to successive target portions over the substrate, and the corrections include interfield corrections that are calculated and applied for a target portion in accordance with its position on the substrate. In an embodiment, the interfield corrections for each target portion include corrections calculated by reference to a radial position of the target portion on the substrate. In an embodiment, the corrections further include intrafield corrections that are calculated and applied to every target portion independently of the position of the target portion across the substrate. In an embodiment, the apparatus is arranged to apply the pattern repeatedly to successive target portions over the substrate, and the corrections include intrafield corrections that are calculated and applied to every target portion independently of the position of the target portion across the substrate. In an embodiment, the intrafield corrections are calculated based on height deviations that are observed within each target portion when averaged across many target portions. In an embodiment, the corrections are calculated with regard to other corrections being made when controlling the positioning of the applied pattern, so to avoid over-correcting positioning errors that would be corrected by another correction mechanism.

In an embodiment, there is provided a computer program product comprising machine-readable instructions for causing one or more processors to implement the controller of a lithographic apparatus as described herein.

In an embodiment, there is provided a data processing system comprising one or more processors programmed to implement the controller of a lithographic apparatus as described herein.

In an embodiment, there is provided a computer program product comprising machine-readable instructions for causing one or more processors to perform the steps (a) to (d) of a method as described above.

In an embodiment, there is provided a data processing system comprising one or more processors programmed to perform the steps (a) to (d) of a method as claimed as described above.

An embodiment of the invention may be implemented using a computer program containing one or more sequences of machine-readable instructions describing a methods of controlling the lithographic apparatus using height map data as described above. This computer program may be executed for example within the control unit LACU of FIG. 2, or some other controller. There may also be provided a data storage medium (e.g., semiconductor memory, magnetic or optical disk) having such a computer program stored therein. Where an existing lithographic apparatus, for example of the type shown in FIG. 1, is already in production and/or in use, the invention can be implemented by the provision of updated computer program products for causing a processor to perform the modified steps HBO and/or PAT of a method shown in FIG. 5 and so calculate and apply overlay corrections.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A lithographic apparatus configured to apply a pattern onto a substrate, the apparatus including:
    an alignment sensor configured to measure positions of features on the substrate prior to applying the pattern, the positions being measured in directions parallel to a plane of the substrate; and
    a control system arranged to control the lithographic apparatus to apply the pattern to the substrate while controlling the positioning of the applied pattern in the parallel directions using the positions measured by the alignment sensor, wherein the control system is further arranged to receive data comprising currently measured height deviations representing local height deviations of the substrate measured across the substrate prior to applying the pattern to the substrate, and to calculate and apply corrections in the positioning of the applied pattern in at least one of the parallel directions, based on derivatives of the local height deviations.

2. An apparatus as claimed in claim 1, wherein the control system is arranged to receive, from a database, previously measured height deviations made prior to applying a pattern previously on the same substrate or a similar substrate, and to calculate the corrections based on a change between the currently and previously measured height deviations.

3. An apparatus as claimed in claim 1, further comprising:
a level sensor configured to measure height deviations across the substrate after loading the substrate into the apparatus and prior to applying the pattern,
wherein the control system is arranged to control positioning of the applied pattern in a normal direction of a substrate surface using the height deviations measured by the level sensor, and
wherein the data representing local height deviations that is used to calculate the corrections includes the height deviations measured by the level sensor prior to applying the pattern.

4. An apparatus as claimed in claim 1, wherein the apparatus is arranged to apply the pattern repeatedly to successive target portions over the substrate, and the corrections include interfield corrections that are calculated and applied for a target portion in accordance with its position on the substrate.

5. An apparatus as claimed in claim 4, wherein the interfield corrections for each target portion include corrections calculated by reference to a radial position of the target portion on the substrate.

6. An apparatus as claimed in claim 4, wherein the corrections further include intrafield corrections that are calculated and applied to every target portion independently of the position of the target portion across the substrate.

7. An apparatus as claimed in claim 6, wherein the intrafield corrections are calculated based on height deviations that are observed within each target portion when averaged across many target portions.

8. An apparatus as claimed in claim 1, wherein the apparatus is arranged to apply the pattern repeatedly to successive target portions over the substrate, and the corrections include intrafield corrections that are calculated and applied to every target portion independently of the position of the target portion across the substrate.

9. A device manufacturing method comprising applying patterns in successive layers on a substrate, and processing the substrate to produce functional device features, wherein the applying a pattern in at least one of the layers comprises:
measuring positions of features on the substrate in a lithographic apparatus using an alignment sensor, the positions being measured in directions parallel to a plane of the substrate;
controlling the lithographic apparatus to apply the pattern to the substrate while controlling the positioning of the applied pattern in the parallel directions using the positions measured by the alignment sensor;
obtaining data comprising currently measured height deviations representing local height deviations of the substrate measured across the substrate prior to applying the pattern to the substrate; and
calculating and applying corrections in the positioning of the applied pattern in at least one of the parallel directions, based on derivatives of the local height deviations.

10. A method as claimed in claim 9, wherein the obtaining data representing local height deviations further includes receiving, from a database, previously measured height deviations made prior to applying a pattern previously on the same substrate or a similar substrate, and the calculating corrections are calculated based on a change between the currently and previously measured height deviations.

11. A method as claimed in claim 9, further comprising measuring height deviations across the substrate using a level sensor in the lithographic apparatus after loading the substrate into the apparatus and prior to applying the pattern, wherein the controlling the lithographic apparatus to apply the pattern comprises controlling positioning of the applied pattern in a normal direction of a substrate surface using the height deviations measured by the level sensor, and wherein the data representing local height deviations used to calculate the corrections includes the height deviations measured by the level sensor.

12. A method as claimed in claim 9, wherein the lithographic apparatus is controlled to apply the pattern repeatedly to successive target portions over the substrate, and the corrections include interfield corrections that are calculated and applied for a target portion in accordance with its position on the substrate.

13. A method as claimed in claim 12, wherein the interfield corrections for each target portion include corrections calculated by reference to a radial position of the target portion on the substrate.

14. A method as claimed in claim 12, wherein the corrections further include intrafield corrections that are calculated and applied to every target portion independently of the position of the target portion across the substrate.

15. A method as claimed in claim 9, wherein the apparatus is arranged to apply the pattern repeatedly to successive target portions over the substrate, and the corrections include intrafield corrections that are calculated and applied to every target portion independently of the position of the target portion across the substrate.

16. A method as claimed in claim 15, wherein the intrafield corrections are calculated based on height deviations that are observed within each target portion when averaged across many target portions.

17. A non-transitory computer program product comprising machine-readable instructions for causing one or more processors to cause performance of the measuring, controlling, obtaining and calculating of a method as claimed in claim 9.

18. A data processing system comprising one or more hardware processors programmed to cause performance of the instructions of claim 17.

19. A non-transitory computer program product comprising machine-readable instructions configured to cause a processor system to cause:
obtaining of measured positions of features on a substrate, the positions measured in directions parallel to a plane of the substrate;
control of a lithographic apparatus to apply a pattern to the substrate while controlling the positioning of the applied pattern in the parallel directions using the measured positions;
obtaining of data representing local height deviations of the substrate measured across the substrate prior to applying the pattern to the substrate; and
calculation and application of corrections in the positioning of the applied pattern in at least one of the parallel directions, based on derivatives of the local height deviations.

20. A data processing system comprising one or more hardware processors programmed to cause performance of the instructions of claim 19.

* * * * *